(12) United States Patent
Ohara

(10) Patent No.: US 12,684,875 B2
(45) Date of Patent: Jul. 14, 2026

(54) TRANSIENT VOLTAGE ABSORPTION ELEMENT

(71) Applicant: Murata Manufacturing Co., Ltd., Nagaokakyo (JP)

(72) Inventor: Tatsuya Ohara, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 366 days.

(21) Appl. No.: 18/439,886

(22) Filed: Feb. 13, 2024

(65) Prior Publication Data

US 2024/0290773 A1 Aug. 29, 2024

Related U.S. Application Data

(63) Continuation of application No. PCT/JP2022/029800, filed on Aug. 3, 2022.

(30) Foreign Application Priority Data

| | | |
|---|---|---|
| Aug. 19, 2021 | (JP) | 2021-134220 |
| Oct. 19, 2021 | (JP) | 2021-171084 |

(51) Int. Cl.
*H10D 89/60* (2025.01)

(52) U.S. Cl.
CPC ................................... *H10D 89/611* (2025.01)

(58) Field of Classification Search
CPC .......... H10D 89/611; H10D 1/62; H10D 8/25; H10D 8/50; H10D 8/00; H10D 48/021; H10D 84/00; H10D 84/038; H02H 9/04
See application file for complete search history.

(56) References Cited

U.S. PATENT DOCUMENTS

| | | |
|---|---|---|
| 2005/0063129 A1 | 3/2005 | Kato |
| 2006/0114634 A1 | 6/2006 | Terada |
| 2007/0002513 A1 | 1/2007 | Matsuoka et al. |
| 2012/0139083 A1* | 6/2012 | Ghia .................. H10W 20/496 |
| | | 257/532 |

(Continued)

FOREIGN PATENT DOCUMENTS

| | | |
|---|---|---|
| JP | 2000245057 A | 9/2000 |
| JP | 2000299434 A | 10/2000 |

(Continued)

OTHER PUBLICATIONS

International Search Report in PCT/JP2022/029800, mailed Oct. 25, 2022, 3 pages.

*Primary Examiner* — William B Partridge
*Assistant Examiner* — Chevy J Boegel
(74) *Attorney, Agent, or Firm* — ArentFox Schiff LLP

(57) ABSTRACT

A transient voltage absorption element is provided that includes a first path and a second path, the first path is a current path in which a surge current flows, and the second path is a current path in a frequency band of a signal that propagates through the signal line. The first path includes a series circuit including a diode including a depletion layer capacitance, a first inductor, and a first resistance component, and the second path includes a series circuit including a capacitance, a second inductor, and a second resistance component. A resistance value of the first resistance component is higher than a resistance value of the second resistance component.

20 Claims, 12 Drawing Sheets

101

(56)          References Cited

U.S. PATENT DOCUMENTS

2019/0081135  A1*    3/2019  Karino ................... H02M 1/36

FOREIGN PATENT DOCUMENTS

| | | |
|---|---|---|
| JP | 2005117000 A | 4/2005 |
| JP | 2006156846 A | 6/2006 |
| JP | 2007013031 A | 1/2007 |
| JP | 2007202380 A | 8/2007 |
| JP | 2010057332 A | 3/2010 |
| JP | 2012182381 A | 9/2012 |
| JP | 2014502428 A | 1/2014 |

* cited by examiner

TRANSIENT VOLTAGE ABSORPTION ELEMENT

CROSS REFERENCE TO RELATED APPLICATIONS

This application is a continuation of International Application No. PCT/JP2022/029800, filed Aug. 3, 2022, which claims priority to Japanese Patent Application No. 2021-171084, filed Oct. 19, 2021, and Japanese Patent Application No. 2021-134220, filed Aug. 19, 2021, the entire contents of each of which are hereby incorporated by reference in their entirety.

TECHNICAL FIELD

The present disclosure relates to a transient voltage absorption element that absorbs transient abnormal voltage due to electrostatic discharge (ESD) or the like or a surge such as a lightning surge, a switching surge, or the like.

BACKGROUND

Generally, when a transient voltage absorption element is inserted between a transmission line and ground, a high-frequency signal leaks to the ground due to the stray capacitance of the transient voltage absorption element, which thus degrades the transmission characteristics of the transmission line.

Japanese Patent Application Publication No. 2000-245057 (hereinafter "Patent Literature 1") discloses a transient voltage absorption circuit that protects an ultra-high frequency circuit in a semi-millimetric wave band and a millimetric wave band from a static electricity surge. In the transient voltage absorption circuit of Patent Literature 1, diodes are connected so as to be in a reverse polarity in a direct current manner, respectively, between one end portions (point A and point B) of microstrip lines of a quarter wavelength that are connected to an input end and an output end of a circuit to be protected, ground, and a power source. The point A and the point B are grounded through a capacitor in order to bypass high frequencies.

By the circuit configuration, a depletion layer capacitance of a diode is connected in parallel to the capacitor at high frequencies, so that the depletion layer capacitance of a diode causes little effect. In addition, a microstrip line of a quarter wavelength, since functioning as an open stub and becomes high impedance in a used frequency band, has almost no effect on the circuit to be protected due to the connection of the diode, and, on the other hand, absorbs a surge and protects the circuit to be protected from the surge.

The transient voltage absorption circuit shown in Patent Literature 1, in the frequency band that functions as the open stub, in other words, in the used frequency band, is unaffected by the capacitor for a high frequency bypass and the depletion layer capacitance of a diode. For example, when an open stub having an electrical length of a quarter wavelength at 10 GHz is used, while it is possible to reduce the stray capacitance of the transient voltage absorption circuit connected to a signal line in 10 GHz band, a signal desired to be passed through the signal line, in a case of being in a wide frequency band, is affected by the stray capacitance of the transient voltage absorption element at 10 or more GHz band, for example. In other words, the stray capacitance of the transient voltage absorption element causes a high-frequency signal to leak to the ground, which makes an insertion loss of the transmission line large.

SUMMARY OF THE INVENTION

In view of the foregoing, exemplary embodiments of the present disclosure provide a transient voltage absorption circuit that significantly reduces degradation of high frequency transmission characteristics of a transmission line in a used frequency band of a wide frequency band.

In an exemplary embodiment, a transient voltage absorption element is provided that is configured to be connected in shunt between a signal line and a reference potential. In an exemplary aspect, the transient voltage absorption element includes a first path and a second path that are connected in shunt between the signal line and the reference potential. Moreover, the first path is a current path in which a surge current flows, and the second path is a current path in a frequency band of a signal that propagates through the signal line. The first path includes a series circuit including a diode having a depletion layer capacitance, a first inductor component, and a first resistance component. The second path includes a series circuit including a capacitance, a second inductor component, and a second resistance component. Moreover, the capacitance is generated between wirings that are electrically connected to the diode, and a resistance value of the first resistance component is higher than a resistance value of the second resistance component.

According to the exemplary aspects of the present disclosure, a transient voltage absorption circuit that significantly reduces degradation of high frequency transmission characteristics of a transmission line in a used frequency band of a wide frequency band is obtained.

DETAILED DESCRIPTION

Figure 1:
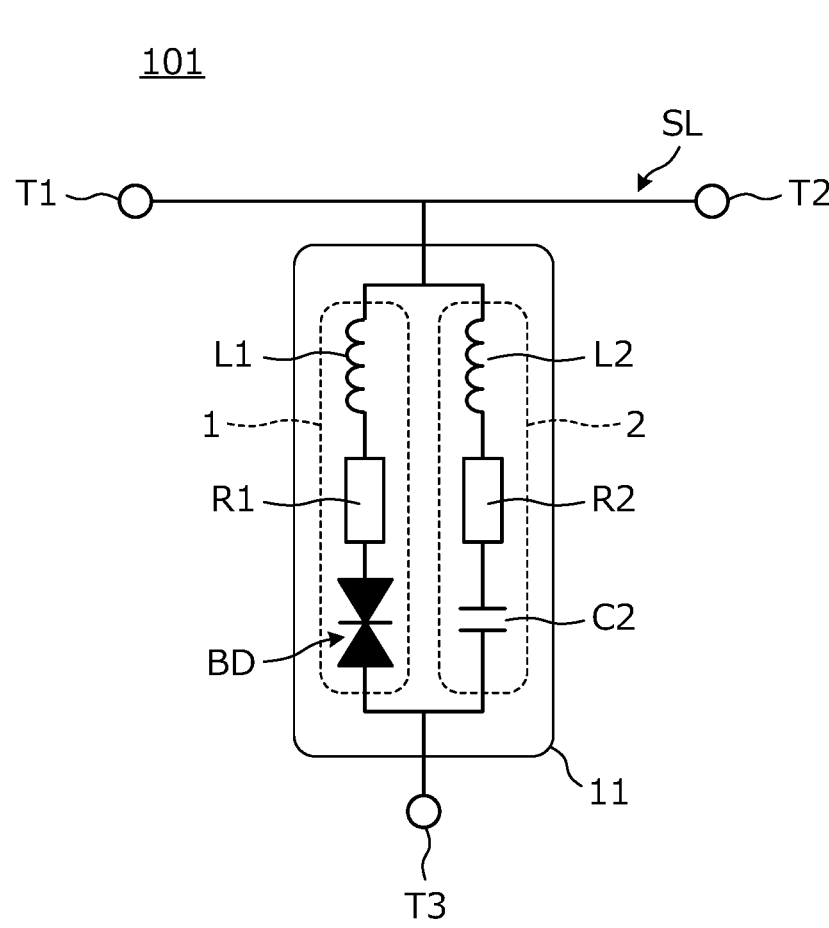
FIG. 1 is a circuit diagram of a transient voltage absorption circuit 101 according to a first exemplary embodiment of the present disclosure.

Hereinafter, a plurality of exemplary embodiments of the present disclosure will be described with reference to the attached drawings and several specific examples. In the drawings, components and elements assigned with the same reference numerals or symbols will represent identical components and elements. While an exemplary embodiment of the present disclosure is divided and described into a plurality of exemplary aspects for the sake of convenience in consideration of ease of description or understanding of main points, elements described in different exemplary embodiments can be partially replaced or combined with each other as would be appreciated to one skilled in the art. In the second and subsequent exemplary embodiments, a description of features common to the first exemplary embodiment will be omitted, and only different features will be described. In particular, the same advantageous functions and effects by the same configurations will not be described one by one for each exemplary embodiment.

First Exemplary Embodiment

FIG. 1 is a circuit diagram of a transient voltage absorption circuit 101 according to a first exemplary embodiment of the present disclosure. The transient voltage absorption circuit 101 includes a first terminal T1, a second terminal T2, a third terminal T3, and a signal line SL between the first terminal T1 and the second terminal T2. Moreover, the third terminal T3 is connected to a reference potential of ground or the like. In addition, a transient voltage absorption element 11 is connected in shunt between the signal line SL and the third terminal T3 (i.e., the reference potential).

The transient voltage absorption element 11 is a two-terminal element and includes a diode BD as a main portion between the terminals. The transient voltage absorption element 11 includes a first path 1 and a second path 2 that are connected in shunt between the signal line SL and the third terminal T3 (i.e., the reference potential).

The first path 1 is a current path in which a surge current flows, and the second path 2 is a current path in a frequency band of a signal that propagates through the signal line SL. However, when a signal that propagates through the signal line SL is a signal in a low frequency band, the signal flows not only in the second path 2 but in the first path 1. Then, as the signal frequency is increased, the ratio of the current of the signal flowing in the second path 2 is increased. In other words, the ratio of the current of the signal flowing in the first path 1 and the second path 2 varies with the frequency band.

According to the exemplary aspect, the first path 1 includes a series circuit by a diode BD including a depletion layer capacitance, a first inductor L1, and a first resistance component R1. The diode BD is configured by a plurality of diodes of which the forward directions are opposite to each other. In addition, the second path 2 includes a series circuit by a capacitance C2, a second inductor L2, and a second resistance component R2.

The capacitance C2 is a capacitance generated between wirings that are electrically connected to the diode BD, which will be illustrated later. The first resistance component R1 is a resistance component of a wiring layer and an epitaxial layer (e.g., a depletion layer), and the second resistance component R2 is a resistance component of the wiring layer in the current path in a high frequency band.

The transient voltage absorption element 11 according to the present exemplary embodiment is characterized in that the resistance value of the first resistance component R1 is higher than the resistance value of the second resistance component R2.

Figure 2:
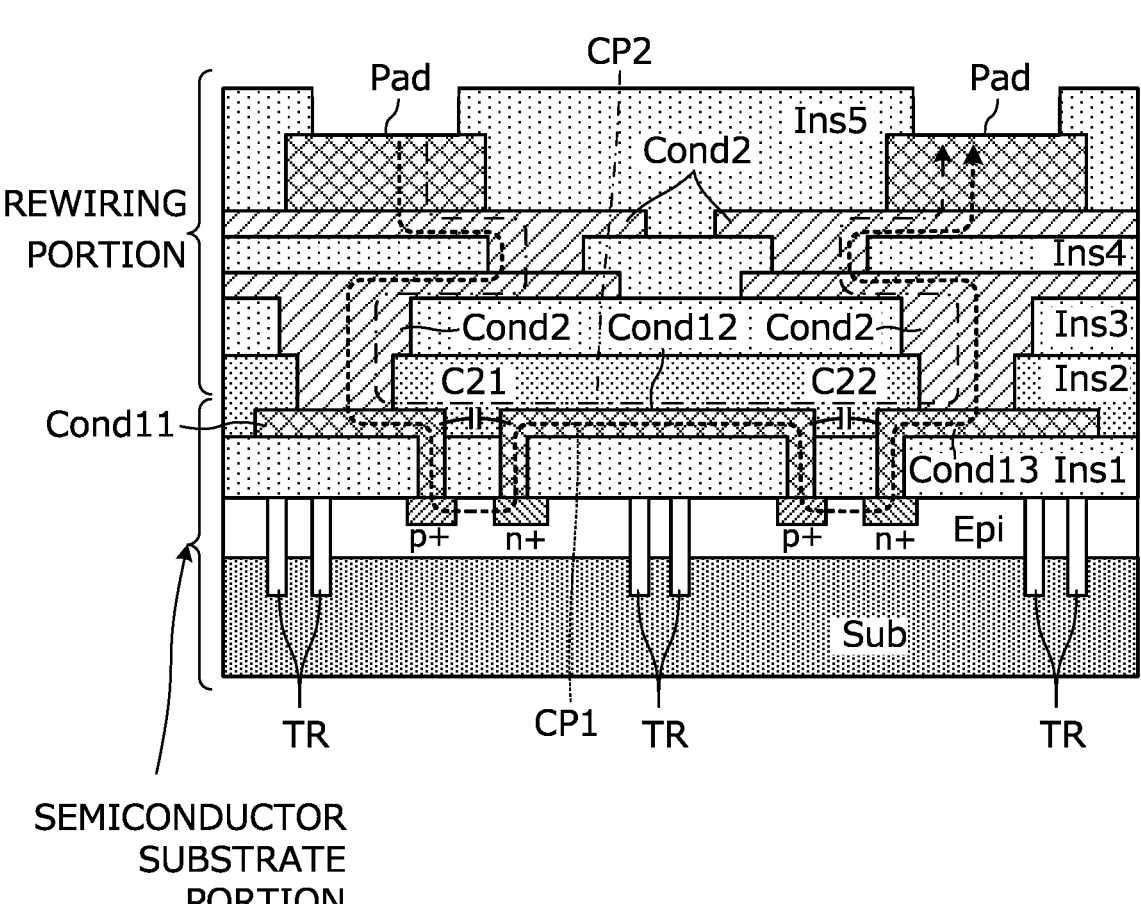
FIG. 2 is a cross-sectional view of a transient voltage absorption element 11, that is, in particular, a view showing a first path 1 and a second path 2 that are shown in FIG. 1.
Figure 3:
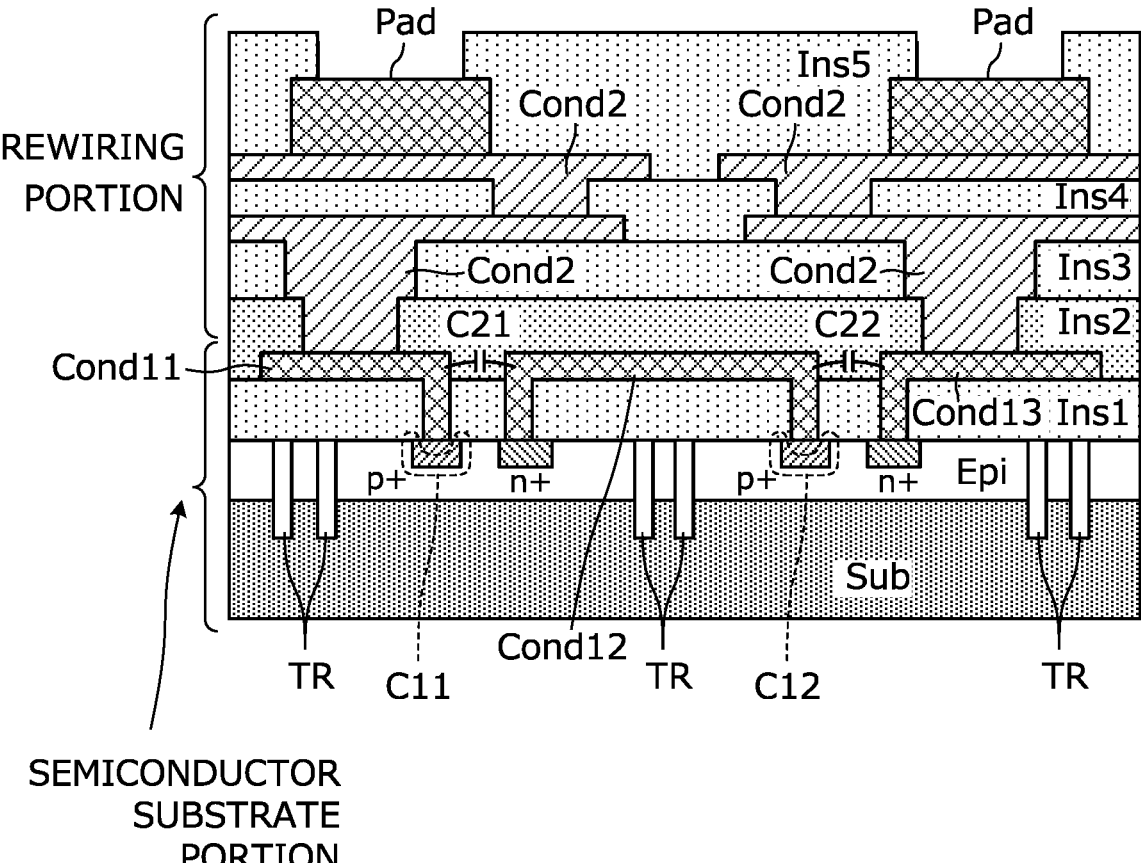
FIG. 3 is a cross-sectional view of the transient voltage absorption element 11, that is, in particular, a view illustrating a portion of a depletion layer capacitance of a diode BD and capacitance C2 that are shown in FIG. 1.

FIG. 2 and FIG. 3 are cross-sectional views of the transient voltage absorption element 11. As will be described in detail later, FIG. 2 illustrates the first path 1 and the second path 2 that are shown in FIG. 1, and FIG. 3 is illustrates a portion of the depletion layer capacitance of the diode BD, and the capacitance C2 that are shown in FIG. 1.

According to the exemplary aspect, the transient voltage absorption element 11 includes a semiconductor substrate portion and a rewiring portion. In particular, the semiconductor substrate portion includes a semiconductor substrate Sub, an epitaxial layer Epi, a trench TR, an insulator Ins1, and conductive materials Cond11, Cond12, and Cond13. Moreover, the rewiring portion includes insulators Ins2, Ins3, Ins4, and Ins5, a conductive material Cond2, and a pad Pad. The pad Pad may include a conductive material for forming an electrode of a plurality of layers. In other words, the pad Pad may include a base layer and a surface layer, for example, and may further include a cohesive layer between the foundation layer and the surface layer.

According to an exemplary aspect, the semiconductor substrate Sub can be formed from Si, GaAs, or the like, for example. Moreover, the insulators Ins1, Ins2, Ins3, Ins4, and Ins5 can be formed from $SiO_2$, SiN, a solder resist, or the like, for example. The conductive materials Cond11, Cond12, and Cond13 can be formed from Al or Cu, for example. In addition, the pad Pad can use Ni, Cr, or an alloy including Ni and Cr, for example, for a material of the base layer, Ti or W can be used for a material of the cohesive layer, and Au or other precious metals can be used for a material of the surface layer. When adjacent insulators are made of the same material, the boundary can be unclear. For example, the insulator Ins2 and the insulator Ins3, when being made of the same material, can be seen as an integrated body in an exemplary aspect.

The epitaxial layer Epi is provided on a surface of the semiconductor substrate Sub. A p+ region and an n+ region are provided in a surface layer of the epitaxial layer Epi. The insulator Ins1 is provided on a surface of the epitaxial layer Epi. The conductive materials Cond11, Cond12, and Cond13 are provided from the surface of the epitaxial layer Epi to the p+ region and the n+ region. In addition, the trench TR is provided from the insulator Ins1 to the semiconductor substrate Sub.

The conductive material Cond2 electrically connected to the conductive materials Cond11 and Cond13 is provided in the rewiring portion. The pad Pad is provided on the conductive material Cond2 being the uppermost layer.

As shown in FIG. 3, depletion layer capacitances C11 and C12 are provided at the depletion layer of an interface between the epitaxial layer Epi and the p+ region. A capacitance C21 is provided between the conductive material Cond11 and the conductive material Cond12, and a capacitance C22 is provided between the conductive material Cond12 and the conductive material Cond13. In addition, a capacitance C23 is provided between the conductive material and the epitaxial layer Epi, and a capacitance C24 is provided between the conductive material Cond2 and the epitaxial layer Epi. Furthermore, a capacitance C25 is provided between the conductive material Cond2 and the conductive material Cond2.

According to the exemplary aspect, the capacitance C21 in FIG. 3 is a capacitance generated between Cond11 and Cond12, and the capacitance C22 is a capacitance generated between Cond12 and Cond13.

In FIG. 2, a current path CP1 shown by a dashed line is equivalent to a portion of the first path 1 in FIG. 1, and a current path CP2 shown by an a dashed-dotted line is equivalent to a portion of the second path 2 in FIG. 1. In this configuration, the first path 1 being a current path in which a surge current flows includes the p+ region and n+ region for a diode, and the epitaxial layer Epi. In addition, the first path 1 includes a via of the conductive materials Cond11 and Cond12. On the other hand, the second path 2 includes the conductive materials Cond11 and Cond12, the capacitances C21 and C22 generated between the conductive materials Cond11 and Cond12, and the like.

The current path CP1 shown in FIG. 2 passes through the p+ region and n+ region for a diode, the epitaxial layer Epi, and the via of the conductive materials Cond11 and Cond12, so that the resistance value of the first resistance component R1 shown in FIG. 1 is higher than the resistance value of the second resistance component R2. Similarly, the inductance of the first inductor L1 shown in FIG. 1 is higher than the inductance of the second inductor L2.

Figure 4:
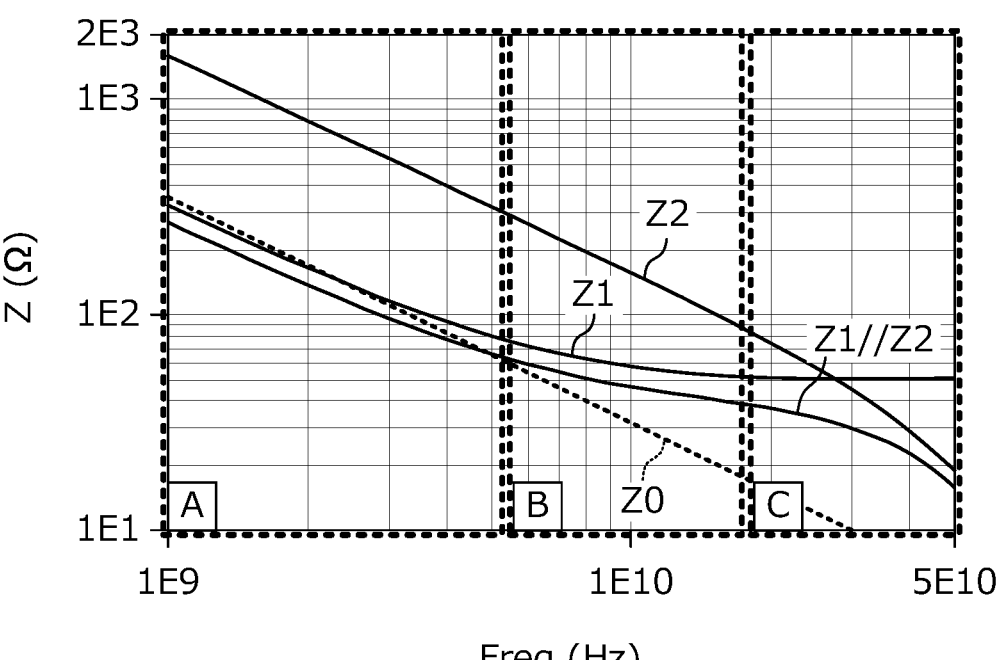
FIG. 4 is a graph showing frequency dependence of impedance by a stray capacitance (a combined capacitance of the depletion layer capacitance of the diode BD and the capacitance C2) of the transient voltage absorption element 11.

FIG. 4 is a graph showing frequency dependence of impedance by a stray capacitance (i.e., a combined capacitance of the depletion layer capacitance of the diode BD and the capacitance C2) of the transient voltage absorption element 11. In FIG. 4, a horizontal axis indicates frequency, and a vertical axis indicates impedance. A characteristic curve Z1 in FIG. 4 shows the frequency dependence of the impedance of the first path 1 in FIG. 1, and a characteristic curve Z2 shows the frequency dependence of the impedance of the second path 2 in FIG. 1. A characteristic curve Z1//Z2 shows the frequency dependence of the impedance of the transient voltage absorption element 11. In addition, a characteristic curve Z0 shows the frequency characteristics of the impedance of a predetermined capacitance.

In the example of FIG. 4, a range A shows a frequency range from 1 GHz to 5.4 GHz, a range B shows a frequency range from 5.4 GHz to 18 GHZ, and a range C shows a frequency range from 18 GHz to 50 GHz.

When the depletion layer capacitance of the diode BD is represented by C1, and the capacitance of the capacitance C2 is represented by C2, respectively, the relationship of C1>C2 is satisfied. In addition, when the first resistance component of the first path 1 is represented by R1, and the second resistance component of the second path 2 is represented by R2, the relationship of R1>R2 is satisfied. Moreover, a resonant frequency of the first path 1 is different from a resonant frequency of the second path 2.

In FIG. 4, the impedance (Z1//Z2) of the transient voltage absorption element 11 is combined impedance of impedance Z1 of the first path 1 and impedance Z2 of the second path 2 in the range A (a low frequency band), and the impedance Z2 of the second path 2 is dominant in the range C (a high frequency band). The impedance Z1 of the first path 1, in the high frequency band, is significantly affected by the first resistance component R1, and frequency dependence is reduced.

The impedance Z1 of the first path 1, when the first resistance component R1 and the second resistance component R2 are not present or when the first resistance component R1 is the same as the second resistance component R2, is brought into a state shown as Z0 in FIG. 4. Elimination of only the first resistance component R1 causes the first resistance component R1<the second resistance component R2, so that some frequency characteristics appear in the impedance Z1//Z2 of the transient voltage absorption element 11.

When the impedance Z1 of the first path 1 includes the first resistance component R1 with a high resistance value, in the frequency range C in FIG. 4, resistance characteristics by the impedance of the first resistance component R1 become significant (e.g., resistance characteristics appear), and, even when the frequency is higher, the impedance Z1 of the first path 1 does not continue to fall but remains high. In other words, in the frequency range C, the impedance Z1 of the first path 1 functions as a resistance rather than a capacitance.

On the other hand, the impedance Z2 of the second path 2 remains as capacitance characteristics even in the high frequency band such as the frequency range C shown in FIG. 4, so that, from around the frequency at which the impedance Z2 falls below the impedance Z1 of the first path 1 that remains high, the capacitance characteristics of the impedance Z1//Z2 of the transient voltage absorption element 11 becomes significant (e.g., the capacitance characteristics appear) on the side of the impedance Z2 of the second path 2. The impedance of the capacitance is lower than the impedance of the first resistance component R1, so that the impedance Z1//22 of the transient voltage absorption element 11 becomes almost only a capacitance on the side of the impedance Z2 of the second path 2, which is a low capacitance.

As described above, when the first resistance component R1 is higher, the impedance that remains high is higher, so that the frequency at which the impedance Z2 of the second path 2 falls below the impedance Z1 of the first path 1 becomes lower. As a result, the characteristics of the impedance Z1//Z2 of the transient voltage absorption element 11 are improved over a wider frequency range and from a lower frequency.

In the present exemplary embodiment, since the resistance value of the first resistance component R1 shown in FIG. 1 is higher than the resistance value of the second resistance component R2 (since the resistance value of the first resistance component R1 is high), as described above, the characteristics of the impedance Z1//22 of the transient voltage absorption element 11 are improved over a wider frequency range and from a lower frequency.

According to the present exemplary embodiment, since the first path 1 is a current path in which a surge current flows includes the first resistance component R1 with high resistance, an amount of signals that propagate through the signal line and leak through the first path 1 to the reference potential is significantly reduced. In addition, the first path 1 includes the first inductor L1 of high inductance, so that the number of signals that propagate through the signal line and leak to the reference potential through the first path 1 is significantly reduced. Moreover, the capacitance C2 of the second path 2 can be smaller than the depletion layer capacitance of the diode BD, so that the number of signals that propagate through the signal line and leak to the reference potential through the second path 2 is also significantly reduced. As a result, a transient voltage absorption circuit is provided that significantly reduces degradation of high frequency transmission characteristics of a transmission line in a used frequency band of a wide frequency band.

In addition, although a technique of significantly reducing degradation of insertion loss in a wide frequency band by reducing the PN junction area of a diode to lower a capacitance is normally used, the same characteristics as lowering the capacitance of a diode are obtained simply by increasing the first resistance component R1 or the first inductor L1, so that the PN junction area does not need to be reduced to lower a capacitance. Therefore, surge current resistance characteristics of the diode BD are not reduced.

Furthermore, the capacitance of the entire transient voltage absorption element 11 is reduced in the high frequency band, so that degradation of the insertion loss characteristics in the high frequency band is also significantly reduced.

Second Exemplary Embodiment

A second exemplary embodiment illustrates some structures that increase a resistance value of a first resistance component.

Figure 5:
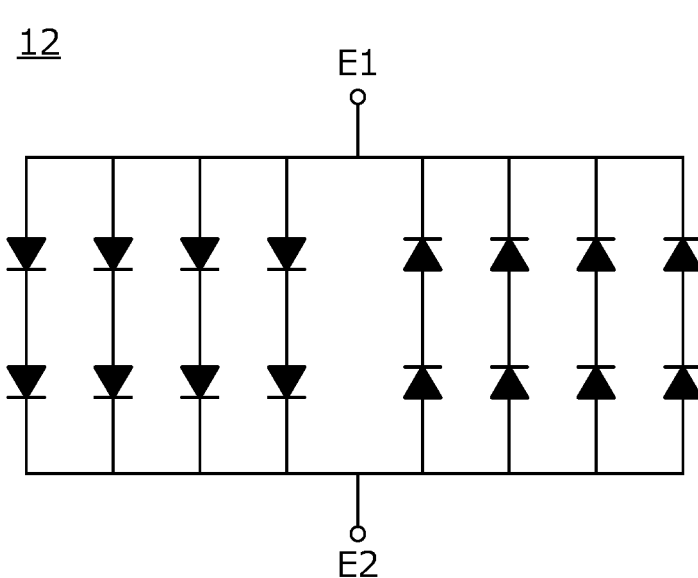
FIG. 5 is a circuit diagram of a transient voltage absorption element 12 according to a second exemplary embodiment of the present disclosure.

FIG. 5 is a circuit diagram of a transient voltage absorption element 12 according to the second exemplary embodiment of the present disclosure. In FIG. 5, an element equivalent to the first inductor L1, the second inductor L2, the first resistance component R1, the second resistance component R2, and the capacitance C2 that are shown in FIG. 1 is not specified. The transient voltage absorption element 12 includes eight diodes that define a direction from a first terminal electrode E1 to a second terminal electrode E2 as a forward direction, and eight diodes that define a direction from the second terminal electrode E2 to the first terminal electrode E1 as a forward direction. It is noted that, although the transient voltage absorption element 12 shown in FIG. 5 includes eight diodes in each direction as an example, the number of diodes is not limited to this example and can be different numbers of diodes in alternative aspects.

Figure 6:
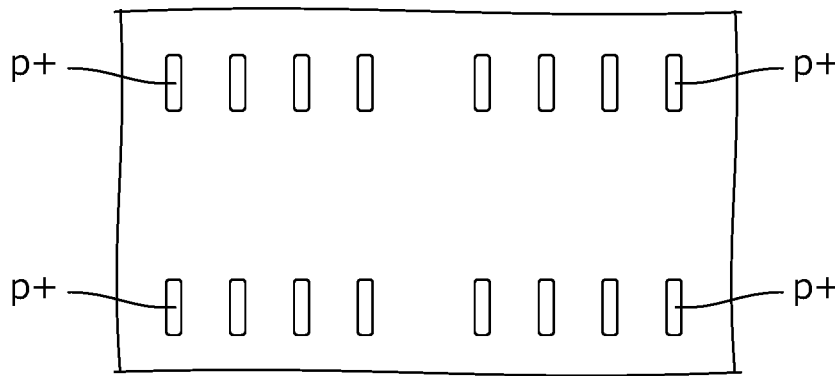
FIG. 6 is a plan view showing a p+ region provided in a surface layer of an epitaxial layer Epi on a semiconductor substrate.
Figures 7A, 7B:
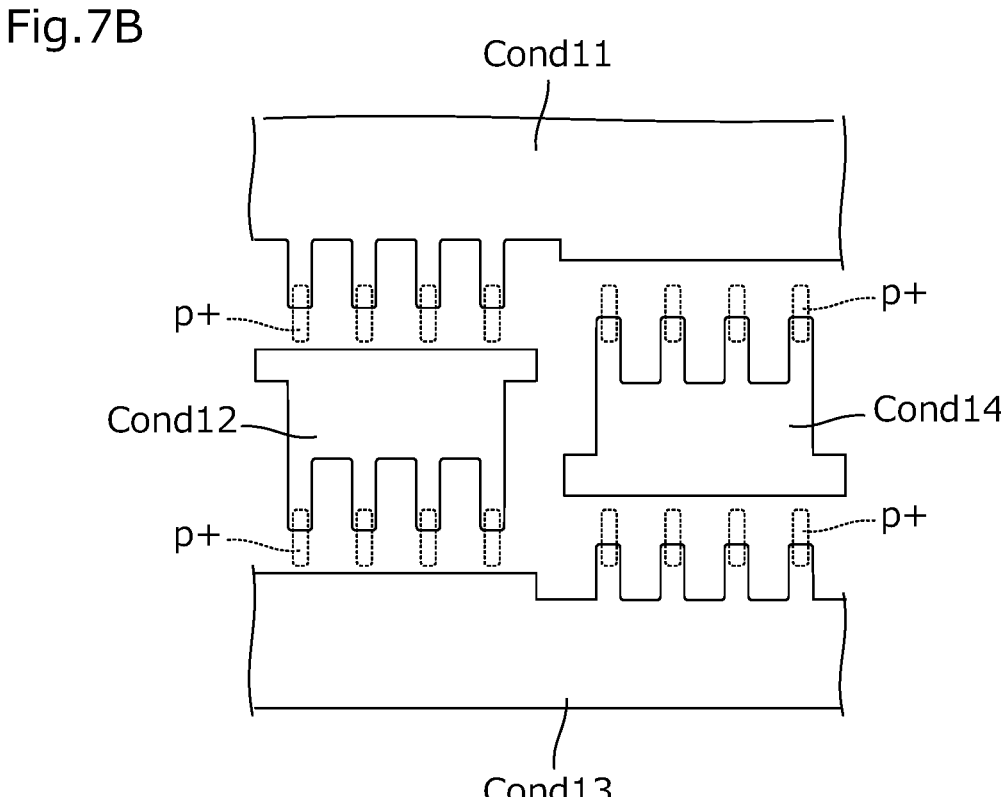
FIG. 7A and FIG. 7B are views showing an example of a pattern of conductive materials Cond11, Cond12, Cond13, and Cond14 to be connected to each p+ region.

FIG. 6 is a plan view showing a p+ region provided in a surface layer of an epitaxial layer Epi on a semiconductor substrate. FIG. 7A and FIG. 7B are views showing an example of a pattern of conductive materials Cond11, Cond12, Cond13, and Cond14 to be connected to each p+ region. It is to be noted that FIG. 6, FIG. 7A, and FIG. 7B do not illustrate an n+ region.

In FIG. 7A and FIG. 7B, a distance (i.e., a length of a via portion) of a connection portion between conductive materials Cond11, Cond12, Cond13, and Cond14 and the p+ region is different. In the example shown in FIG. 7B in comparison with FIG. 7A, the distance (i.e., the length of a via portion) of the connection portion between the conductive materials Cond11, Cond12, Cond13, and Cond14 and the p+ region is small. In such a manner, the distance of the connection portion between the conductive materials Cond11, Cond12, Cond13, and Cond14 and the p+ region is reduced, which increases a resistance component (e.g., a first resistance component) to be equivalently connected in series to a diode.

Figure 8A:
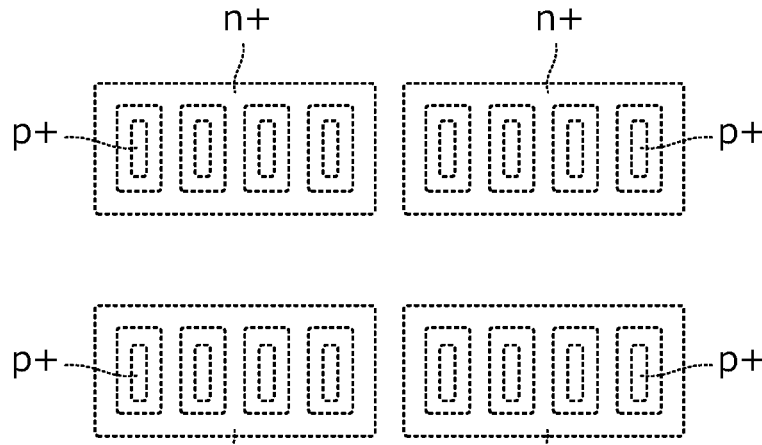
FIG. 8A and FIG. 8B are plan views showing an n+ region provided in the surface layer of the epitaxial layer Epi on the semiconductor substrate.
Figure 8B:
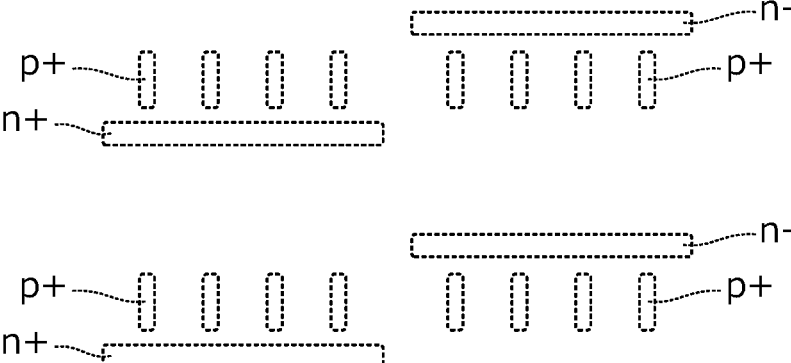

FIG. 8A and FIG. 8B are plan views showing an n+ region provided in the surface layer of the epitaxial layer Epi on the semiconductor substrate. The example shown in FIG. 8A includes an n+ region surrounding the periphery of the p+ region. The example shown in FIG. 8B includes a rod-shaped n+ region extending along four p+ regions.

Figure 9A:
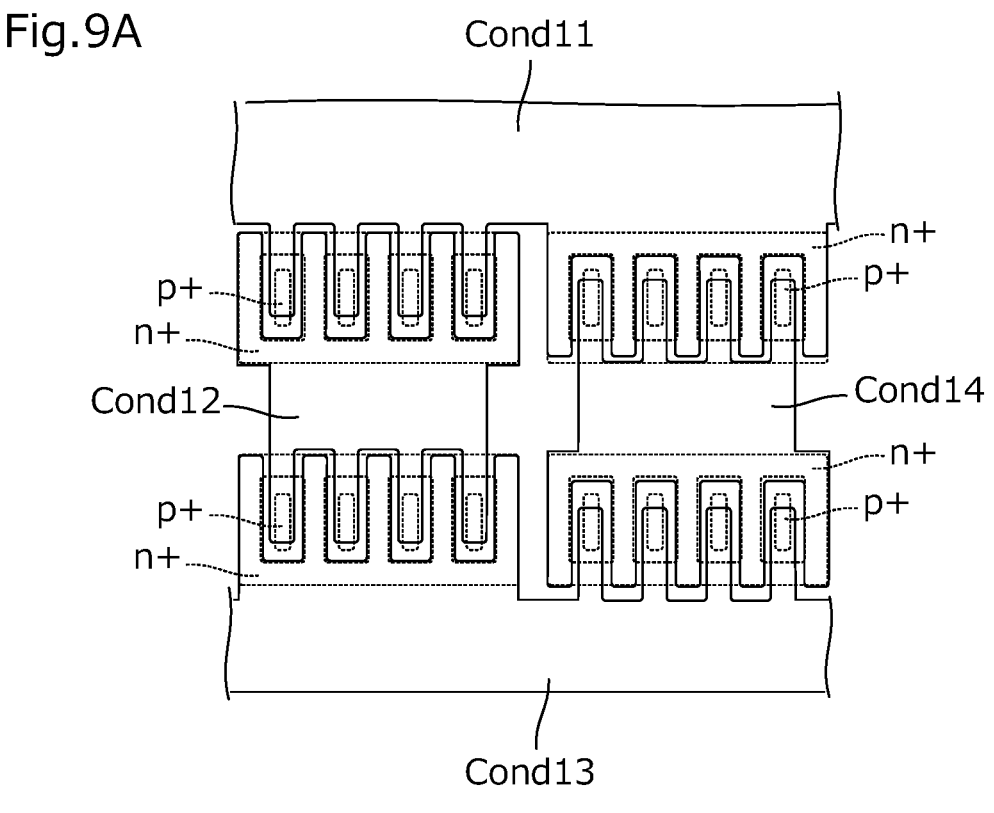
FIG. 9A and FIG. 9B are views showing an example of a pattern of conductive materials Cond11, Cond12, Cond13, and Cond14 to be connected to each n+ region.
Figure 9B:
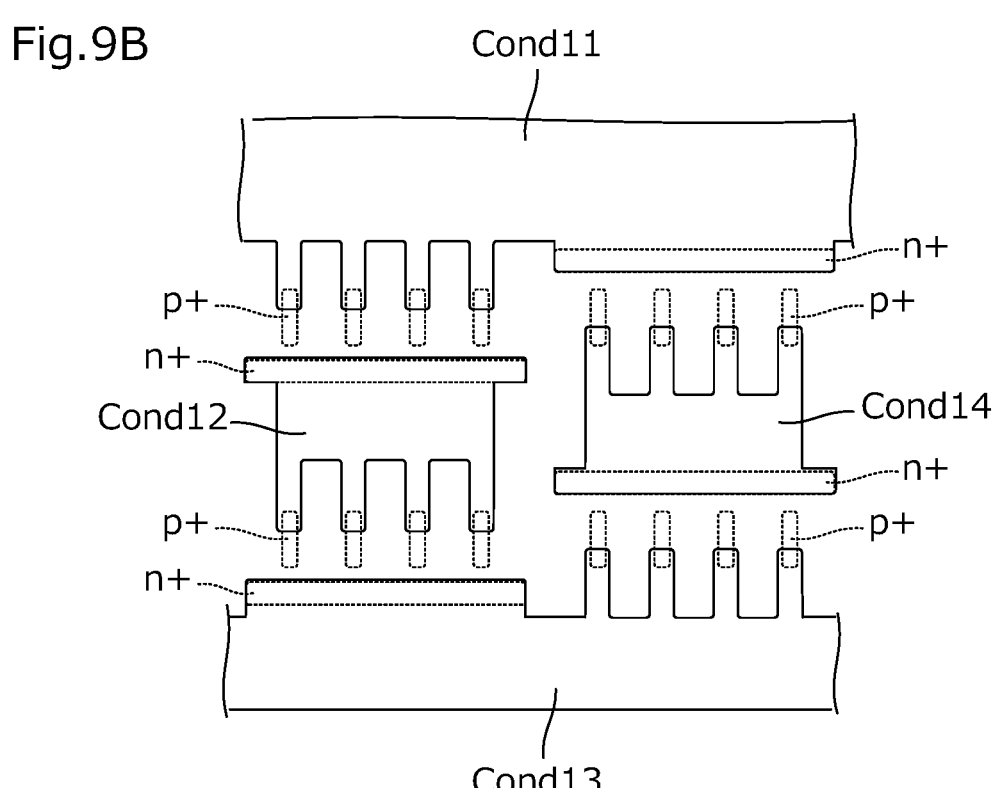

FIG. 9A and FIG. 9B are views showing an example of a pattern of the conductive materials Cond11, Cond12, Cond13, and Cond14 to be connected to each n+ region. In FIG. 9A and FIG. 9B, a distance (i.e., a length of a via portion) of a connection portion between the conductive materials Cond11, Cond12, Cond13, and Cond14 and the n+ region is different. In the example shown in FIG. 9A, the conductive material is connected to the n+ region in a finger-shaped pattern portion, while, in the example shown in FIG. 9B, the conductive material is connected to the n+ region only in a rod-shaped pattern portion. In other words, in the example shown in FIG. 9B in comparison with FIG. 9A, the distance (i.e., the length of a via portion) of the connection portion between the conductive materials Cond11, Cond12, Cond13, and Cond14 and the n+ region is small. In such a manner, the distance of the connection portion between the conductive materials Cond11, Cond12, Cond13, and Cond14 and the n+ region is reduced, which increases a value of the first resistance component.

As shown above, the value of the first resistance component is able to be determined based on a length of the conductive material electrically connected to the p+ region, a length of the conductive material electrically connected to the n+ region, and a facing distance of the n+ region to the p+ region in a plane direction, and a combination of such a length and distance.

Third Exemplary Embodiment

A third exemplary embodiment illustrates another structure that increases a resistance value of a first resistance component.

Figure 10:
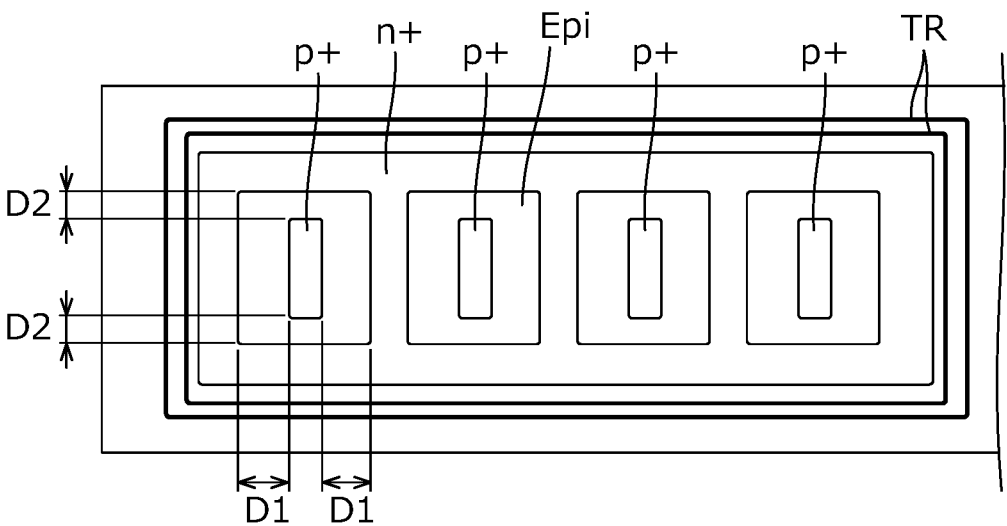
FIG. 10 is a plan view showing a structure of a portion in which a plurality of diodes of the transient voltage absorption element according to a third exemplary embodiment are provided.

FIG. 10 is a plan view showing a structure of a portion in which a plurality of diodes of the transient voltage absorption element according to the third exemplary embodiment are provided. As shown in FIG. 10, a p+ region and an n+ region are provided in a surface layer of the epitaxial layer Epi. Although a conductive material (e.g., the conductive material Cond11 and the like shown in FIG. 2) is provided on an upper surface of the p+ region, and a conductive material (e.g., the conductive material Cond12 and the like shown in FIG. 2) is provided on an upper surface of the n+ region, the conductive material is not illustrated in FIG. 10. It is noted that, in the example shown in FIG. 10, the n+ region for four diodes is a pattern that surrounds each p+ region.

In FIG. 10, as a distance between the p+ region and the n+ region is increased, the resistance value in the epitaxial layer Epi is increased. In short, the value of the first resistance component R1 shown in FIG. 1 is increased. The distance D1 and D2 between the p+ region and the n+ region is a distance in which a layer of the same concentration as the concentration of the epitaxial layer Epi is able to be present between an end portion of the p+ region and an end portion of the n+ region that faces the end portion of the p+ region.

Fourth Exemplary Embodiment

A fourth exemplary embodiment illustrates another structure that increases a resistance value of a first resistance component.

Figure 11A:
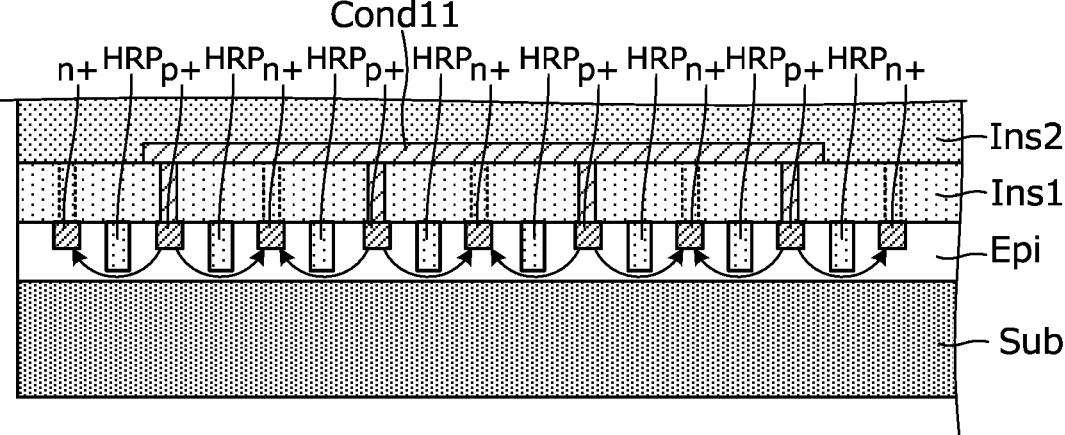
FIG. 11A is a cross-sectional view showing a structure of a portion in which a plurality of diodes of a transient voltage absorption element according to a fourth exemplary embodiment are provided.
Figure 11B:
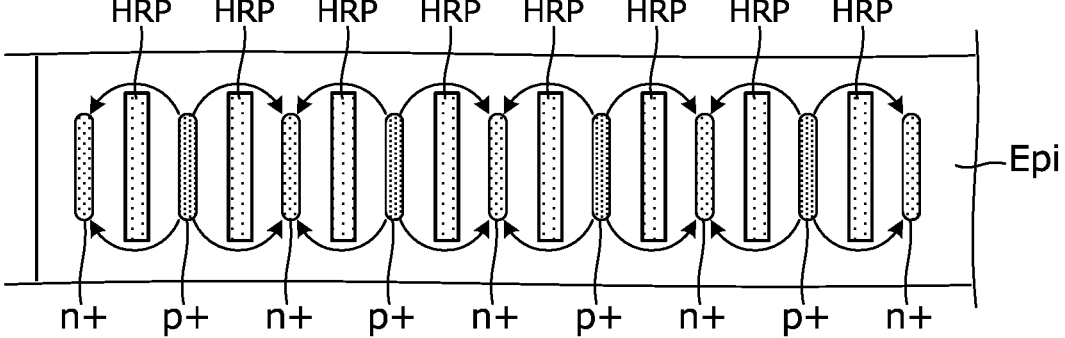
FIG. 11B is a plan view showing the structure of the portion in which the plurality of diodes are provided.

FIG. 11A is a cross-sectional view showing a structure of a portion in which a plurality of diodes of a transient voltage absorption element according to the fourth exemplary embodiment are provided, and FIG. 11B is a plan view showing the structure of the portion in which the plurality of diodes are provided. As shown in FIG. 11A and FIG. 11B, a p+ region and an n+ region are provided in a surface layer of the epitaxial layer Epi. A conductive material Cond11 is provided on an upper surface of the p+ region, and another conductive material is provided on an upper surface of the n+ region.

A high resistance portion HRP is provided between the p+ region and the n+ region. The high resistance portion HRP is, for example, a portion with low impurity doping concentration and higher resistance than the epitaxial layer Epi, or an insulator providing portion.

In FIG. 11A and FIG. 11B, an arrow indicates a path of a current flowing through a diode in the forward direction. In such a manner, the high resistance portion HRP is provided between the p+ region and the n+ region, so that a current flowing through a diode providing portion by the epitaxial layer Epi, the p+ region, and the n+ region bypasses the high resistance portion HRP in a planar direction and a thickness direction. In short, the current bypasses in a direction along a plane of semiconductor substrate Sub and in the thickness direction. Such a structure increases the first resistance component R1 of the diode shown in FIG. 1.

Fifth Exemplary Embodiment

Figure 12A:
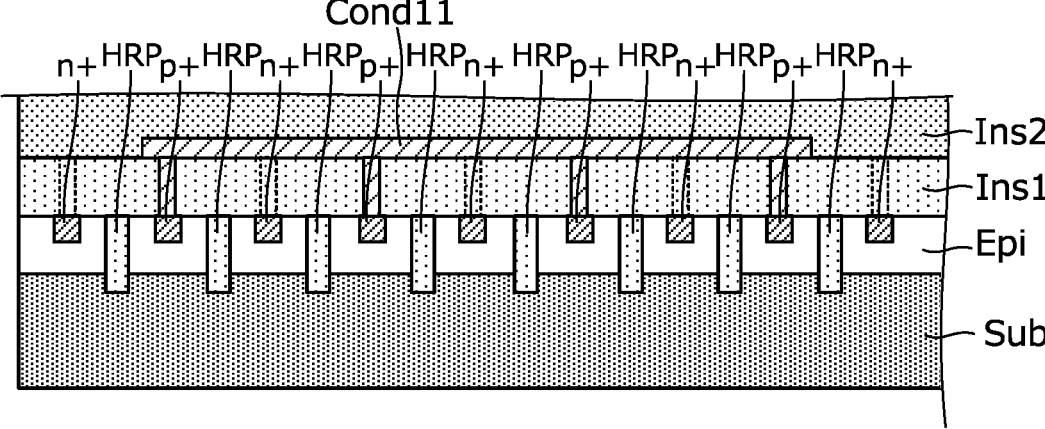
FIG. 12A is a cross-sectional view showing a structure of a portion in which a plurality of diodes of a transient voltage absorption element according to a fifth exemplary embodiment are provided.
Figure 12B:
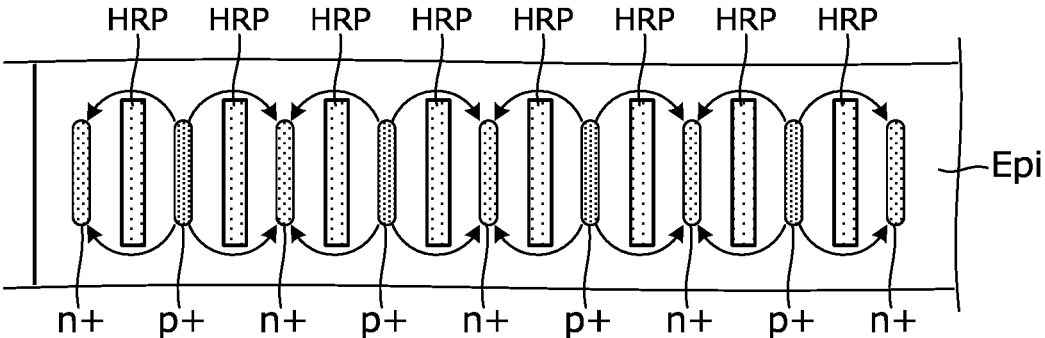
FIG. 12B is a plan view showing the structure of the portion in which the plurality of diodes are provided.

FIG. 12A is a cross-sectional view showing a structure of a portion in which a plurality of diodes of a transient voltage absorption element according to a fifth exemplary embodiment are provided, and FIG. 12B is a plan view showing the structure of the portion in which the plurality of diodes are provided. As shown in FIG. 12A and FIG. 12B, a p+ region and an n+ region are provided on a surface of the epitaxial layer Epi. A conductive material Cond11 is provided on an upper surface of the p+ region, and another conductive material is provided on an upper surface of the n+ region.

According to the exemplary aspect, a high resistance portion HRP is provided between the p+ region and the n+ region. The high resistance portion HRP is, for example, a portion with low impurity doping concentration and higher resistance than the epitaxial layer Epi, or an insulator providing portion. Unlike the example shown in FIG. 11A and FIG. 11B, the high resistance portion HRP reaches up to the semiconductor substrate Sub.

In FIG. 12A and FIG. 12B, an arrow indicates a path of a current flowing through a diode in the forward direction. In such a manner, the high resistance portion HRP is provided between the p+ region and the n+ region, so that a current flowing through a diode providing portion by the epitaxial layer Epi, the p+ region, and the n+ region bypasses the high resistance portion HRP in a planar direction. In short, the current bypasses in a direction along the plane of semiconductor substrate Sub. Such a structure is able to increase the first resistance component R1 of the diode shown in FIG. 1.

In general, it is noted that the present disclosure is not limited to the foregoing exemplary embodiments. Various modifications or changes can be appropriately made by those skilled in the art.

REFERENCE SIGNS LIST

Cond11, Cond12, Cond13, Cond14, Cond2—conductive material
BD—diode
C11, C12—depletion layer capacitance
C2—capacitance C21, C22, C23, C24, C25—capacitance
CP1, CP2—current path
D1, D2—distance
E1—first terminal electrode
E2—second terminal electrode
Epi—epitaxial layer
HRP—high resistance portion
Ins1, Ins2, Ins3, Ins4, Ins5—insulator
L1—first inductor
L2—second inductor
Pad—pad
R1—first resistance component
R2—second resistance component
Sub—semiconductor substrate
SL—signal line
T1—first terminal
T2—second terminal
T3—third terminal
TR—trench
1—first path
2—second path
11, 12—transient voltage absorption element
101—transient voltage absorption circuit

The invention claimed is:

1. A transient voltage absorption element configured to be connected in shunt between a signal line and a reference potential, the transient voltage absorption element comprising:

a first path connected in shunt between the signal line and the reference potential, the first path being a current path in which a surge current flows and comprising a series circuit including a diode having a depletion layer capacitance, a first inductor component, and a first resistance component; and a second path connected in shunt between the signal line and the reference potential, the second path being a current path in a frequency band of a signal that propagates through the signal line and comprising a series circuit including a capacitance, a second inductor component, and a second resistance component;

wherein the capacitance is generated between wirings that are electrically connected to the diode, and wherein the first resistance component has a resistance value that is higher than a resistance value of the second resistance component.

2. The transient voltage absorption element according to claim 1, further comprising:

a semiconductor substrate; and an epitaxial layer on a surface of the semiconductor substrate and including a p+ region and an n+ region in a direction along a plane of the semiconductor substrate.

3. The transient voltage absorption element according to claim 2, wherein the diode is configured by the epitaxial layer, the p+ region, and the n+ region.

4. The transient voltage absorption element according to claim 3, further comprising a layer having a same concentration as the epitaxial layer that is between an end portion of the p+ region and an end portion of the n+ region that faces the end portion of the p+ region at a distance between the p+ region and the n+ region in the direction along the plane of the semiconductor substrate.

5. The transient voltage absorption element according to claim 3, further comprising an insulation portion configured to cause a current to detour, the current flowing through the epitaxial layer between the p+ region and the n+ region.

6. The transient voltage absorption element according to claim 3, further comprising a high resistance portion configured to cause a current to detour, the current flowing through the epitaxial layer between the p+ region and the n+ region.

7. The transient voltage absorption element according to claim 6, wherein the high resistance portion is disposed from the epitaxial layer to the semiconductor substrate.

8. The transient voltage absorption element according to claim 2, further comprising a wiring layer in an upper portion of the p+ region and that is electrically connected to the p+ region.

9. The transient voltage absorption element according to claim 8, wherein:

the diode is configured by the epitaxial layer, the p+ region, and the n+ region, and the wiring layer includes a non-covered region that does not cover a portion of the p+ region.

10. The transient voltage absorption element according to claim 2, further comprising a wiring layer in an upper portion of the n+ region and is electrically connected to the n+ region.

11. The transient voltage absorption element according to claim 10, wherein:

the diode is configured by the epitaxial layer, the p+ region, and the n+ region, and the wiring layer includes a non-covered region that does not cover a portion of the n+ region.

12. The transient voltage absorption element according to claim 2, further comprising:

an insulating layer on a surface of the epitaxial layer; and a trench contacting the insulating layer and provided over the epitaxial layer and a portion of the semiconductor substrate.

13. A transient voltage absorption element comprising:

a first path connected in shunt between a signal line and a reference potential, the first path comprising a series circuit including a diode having a depletion layer capacitance, a first inductor component, and a first resistance component; and a second path connected in shunt between the signal line and the reference potential, the second path comprising a series circuit including a capacitance, a second inductor component, and a second resistance component;

wherein the capacitance is generated between wirings that are electrically connected to the diode, and wherein the first resistance component has a resistance value that is higher than a resistance value of the second resistance component.

14. The transient voltage absorption element according to claim 13, wherein the first path is a current path in which a surge current flows and the second path is a current path in a frequency band of a signal that propagates through the signal line.

15. The transient voltage absorption element according to claim 13, further comprising:

a semiconductor substrate; and an epitaxial layer on a surface of the semiconductor substrate and including a p+ region and an n+ region in a direction along a plane of the semiconductor substrate.

16. The transient voltage absorption element according to claim 15, wherein the diode is configured by the epitaxial layer, the p+ region, and the n+ region.

17. The transient voltage absorption element according to claim 16, further comprising:

a layer having a same concentration as the epitaxial layer that is between an end portion of the p+ region and an end portion of the n+ region that faces the end portion of the p+ region at a distance between the p+ region and the n+ region in the direction along the plane of the semiconductor substrate; and an insulation portion configured to cause a current to detour, the current flowing through the epitaxial layer between the p+ region and the n+ region.

18. The transient voltage absorption element according to claim 15, further comprising:

a wiring layer in an upper portion of the p+ region and that is electrically connected to the p+ region, wherein:

the diode is configured by the epitaxial layer, the p+ region, and the n+ region, and the wiring layer includes a non-covered region that does not cover a portion of the p+ region.

19. The transient voltage absorption element according to claim 15, further comprising:

a wiring layer in an upper portion of the n+ region and is electrically connected to the n+ region, wherein:

the diode is configured by the epitaxial layer, the p+ region, and the n+ region, and the wiring layer includes a non-covered region that does not cover a portion of the n+ region.

20. The transient voltage absorption element according to claim 15, further comprising:

an insulating layer on a surface of the epitaxial layer; and a trench contacting the insulating layer and provided over the epitaxial layer and a portion of the semiconductor substrate.

\* \* \* \* \*